(12) United States Patent
Chang

(10) Patent No.: US 7,286,364 B2
(45) Date of Patent: Oct. 23, 2007

(54) HEAT DISSIPATING DEVICE FOR A MEMORY CHIP

(76) Inventor: Wan Chien Chang, 235 Chung-Ho Box 8-24, Taipei (TW)

( * ) Notice: Subject to any disclaimer, the term of this patent is extended or adjusted under 35 U.S.C. 154(b) by 14 days.

(21) Appl. No.: 11/269,050

(22) Filed: Nov. 9, 2005

(65) Prior Publication Data

US 2007/0103874 A1    May 10, 2007

(51) Int. Cl.
*H05K 7/00* (2006.01)
*H05K 7/20* (2006.01)

(52) U.S. Cl. .................. 361/719; 361/704; 361/688; 361/684

(58) Field of Classification Search .............. 361/684, 361/683, 679, 719, 704, 705, 707, 714, 715, 361/825, 829, 831, 726, 727, 697, 688; 165/80.2, 165/80.3, 121; 257/719
See application file for complete search history.

(56) References Cited

U.S. PATENT DOCUMENTS

| | | | | |
|---|---|---|---|---|
| 5,055,971 A * | 10/1991 | Fudala et al. | ............... | 361/760 |
| 5,117,330 A * | 5/1992 | Miazga | ........................ | 361/760 |
| 5,214,565 A * | 5/1993 | Flores | ......................... | 361/702 |
| 5,805,430 A * | 9/1998 | Atwood et al. | ............. | 361/829 |
| 6,043,984 A * | 3/2000 | Tseng | ......................... | 361/704 |
| 6,233,150 B1 * | 5/2001 | Lin et al. | ..................... | 361/704 |
| 6,272,019 B1 * | 8/2001 | Edwards et al. | ............ | 361/760 |
| 6,362,978 B1 * | 3/2002 | Boe | ........................... | 361/825 |
| 6,633,491 B2 * | 10/2003 | Malone et al. | ............. | 361/825 |
| 2004/0252461 A1 * | 12/2004 | Wu | ............................. | 361/704 |

* cited by examiner

*Primary Examiner*—Lisa Lea-Edmonds
*Assistant Examiner*—Anthony M Haughton

(57) ABSTRACT

A heat dissipating device for a memory chip comprises a heat dissipating body; a middle section of each of two opposite sides of the heat dissipating body having a hook; a distal end of each hook being bent as a hooking end; wherein the hook can be hooked to the penetrating holes of a circuit board by the hooking ends to buckle the penetrating holes so as to fix a memory chip to the circuit board. Each of the four corners of the heat dissipating body is extended with a protrusion which is bent from the heat dissipating body to have the same orientation as the hook. The heat dissipating body has a recess at a center portion thereof. An outer side of the bending section is chamfered as a guiding angle. The hooking end may be a flat sheet, a cambered sheet or a U shape sheets.

7 Claims, 21 Drawing Sheets

HEAT DISSIPATING DEVICE FOR A MEMORY CHIP

FIELD OF THE INVENTION

The present invention relates to heat dissipating devices, and in particular to a heat dissipating device for a memory chip, wherein the heat dissipating device is integrally formed as an integral body. The heat dissipating device can be assembled quickly by passing the hooks through the penetrating holes of the circuit board. The hooks extending from the heat dissipating body have various forms which provide a firmly secured structure to hook the heat dissipating device to a circuit board of a memory chip.

BACKGROUND OF THE INVENTION

With the increment of the memory operation speed, for 512 Mb DDR2 SDRAM, the heat generated from the memory chip in operation will cause that more the heat dissipation sheets are necessary for heat dissipation.

Referring to FIGS. 1 and 2, in the prior art, the 512 Mb DDR2 SDRAM of HYS72T h has a circuit board 91 which can be inserted into a slot of a computer. A plurality of memory chips are installed on the circuit board. One of a maim memory ship 92 is covered by a heat dissipating sheet 93. The heat dissipating sheet is a metal sheet and is fixed by a bending portion 941 and a buckling strip 94. The buckling strip 94 has two ends which are formed with hooks 942 for hooking the penetrating holes 951, 952 of the circuit board 100 (referring to FIGS. 1A and 1B). Thereby the heat dissipating sheet 93 is fixed.

In this prior art, the buckling strips of the heat dissipating sheet increase the cost and the assembly of the strips are tedious and time consumed. Specifically, the distance between two penetrating holes is smaller than the length of the heat dissipating sheet. It is difficult to align the heat dissipating sheet to the circuit board, and thus the work in assembly is tedious and time consumed. This is the defect in the prior art.

SUMMARY OF THE INVENTION

Accordingly, the primary object of the present invention is to provide a heat dissipating device for a memory chip, wherein the heat dissipating device is integrally formed as an integral body. The heat dissipating device can be assembled quickly by passing the hooks through the penetrating holes of the circuit board. The hooks extending from the heat dissipating body have various forms which provide a firmly secured structure to hook the heat dissipating device to a circuit board of a memory chip.

To achieve above objects, the present invention provides a heat dissipating device for a memory chip. The heat dissipating device comprises a heat dissipating body; a middle section of each of two opposite sides of the heat dissipating body having a hook; a distal end of each hook being bent as a hooking end; wherein the hook can be hooked to the penetrating holes by the hooking ends to buckle the penetrating holes so as to fix a memory chip to the circuit board. Each of the four corners of the heat dissipating body is extended with a protrusion which is bent from the heat dissipating body to have the same orientation as the hook. The heat dissipating body has a recess at a center portion thereof. An outer side of the bending section is chamfered as a guiding angle. The hooking end may be a flat sheet, a cambered sheet or a U shape sheets.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
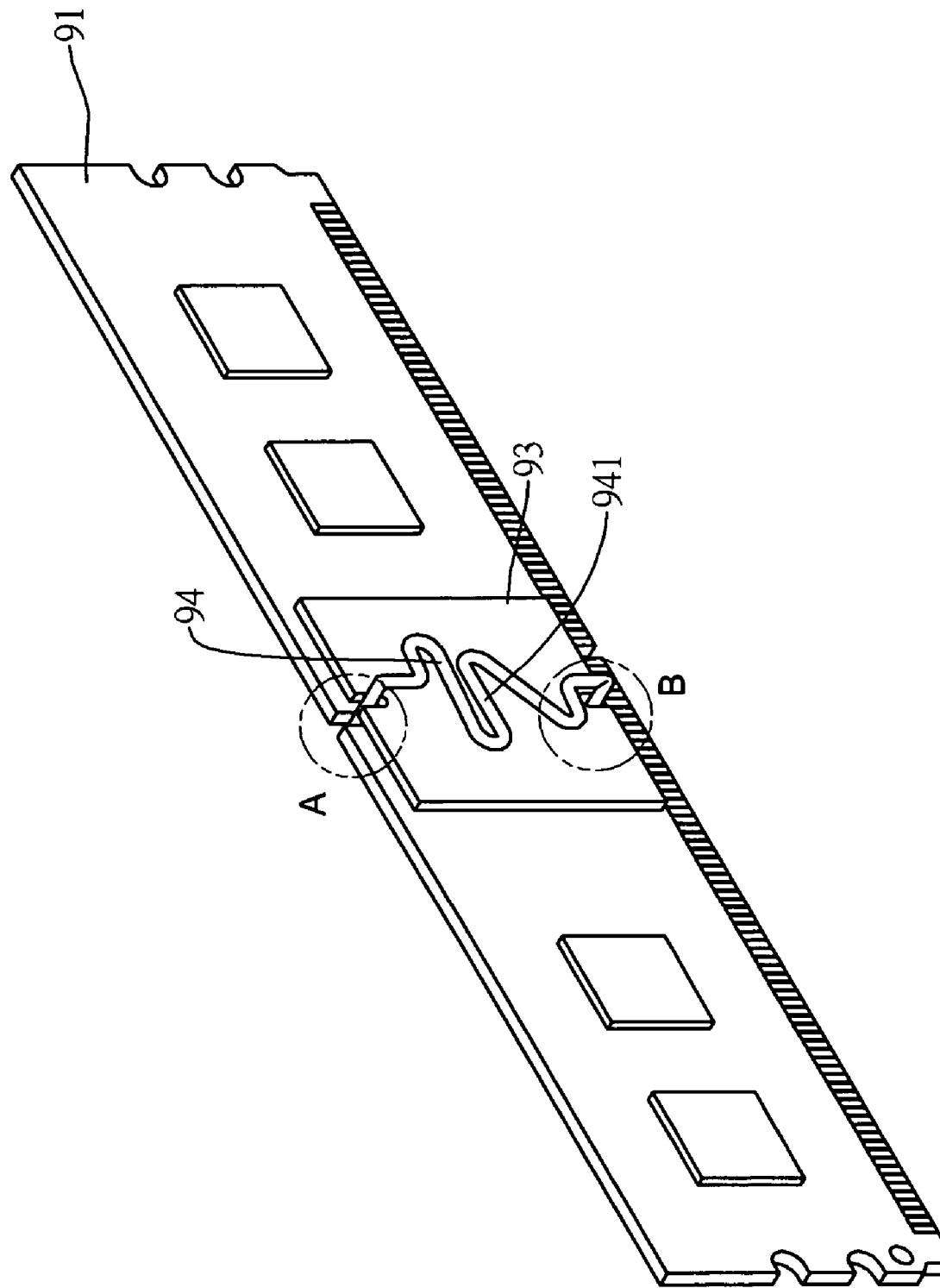
FIG. 1 is a prior art memory with a heat dissipating device.
Figure 1A:
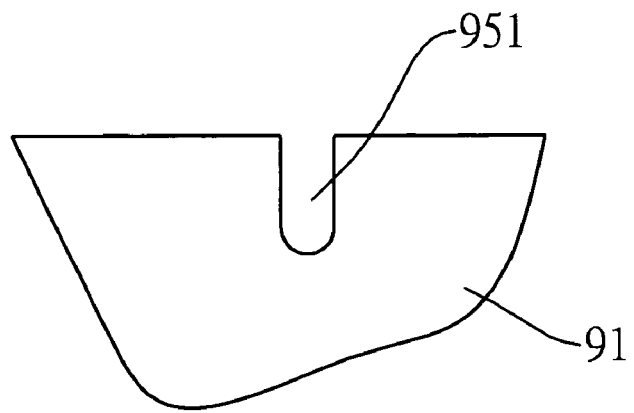
FIG. 1A is an enlarged plane view of the part A in FIG. 1.
Figure 1B:
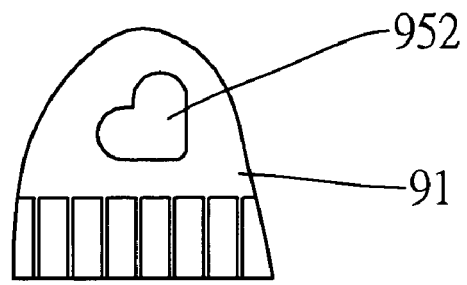
FIG. 1B is a plane enlarged view of the part B in FIG. 1.
Figure 2:
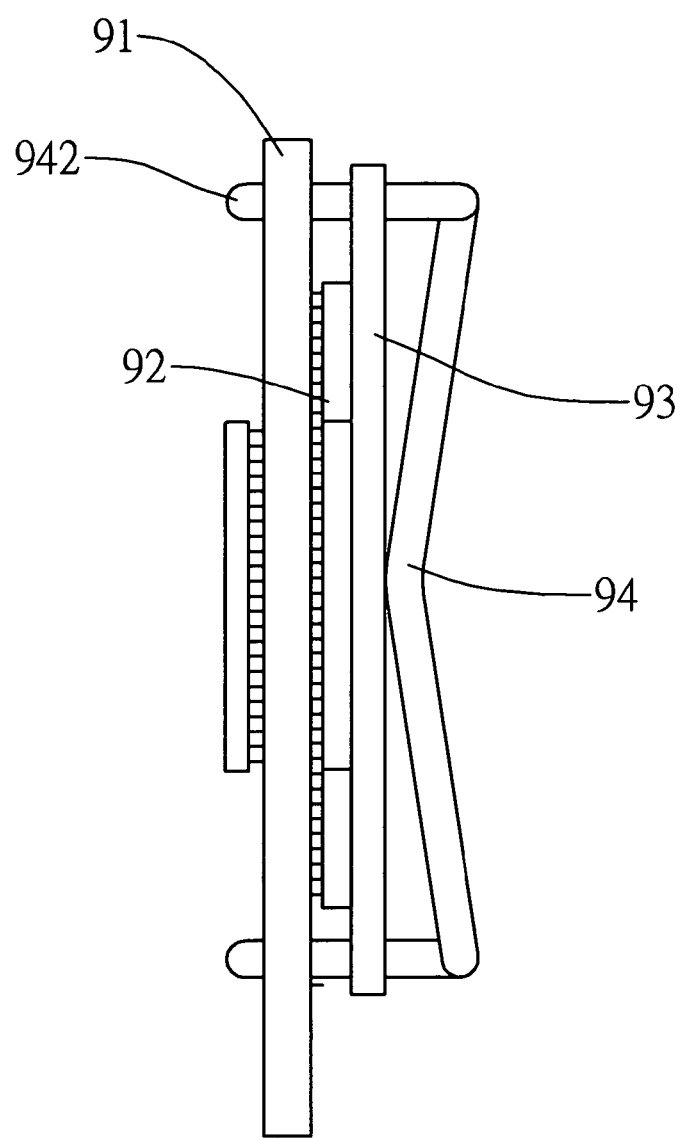
FIG. 2 is a lateral view of FIG. 1.
Figure 3:
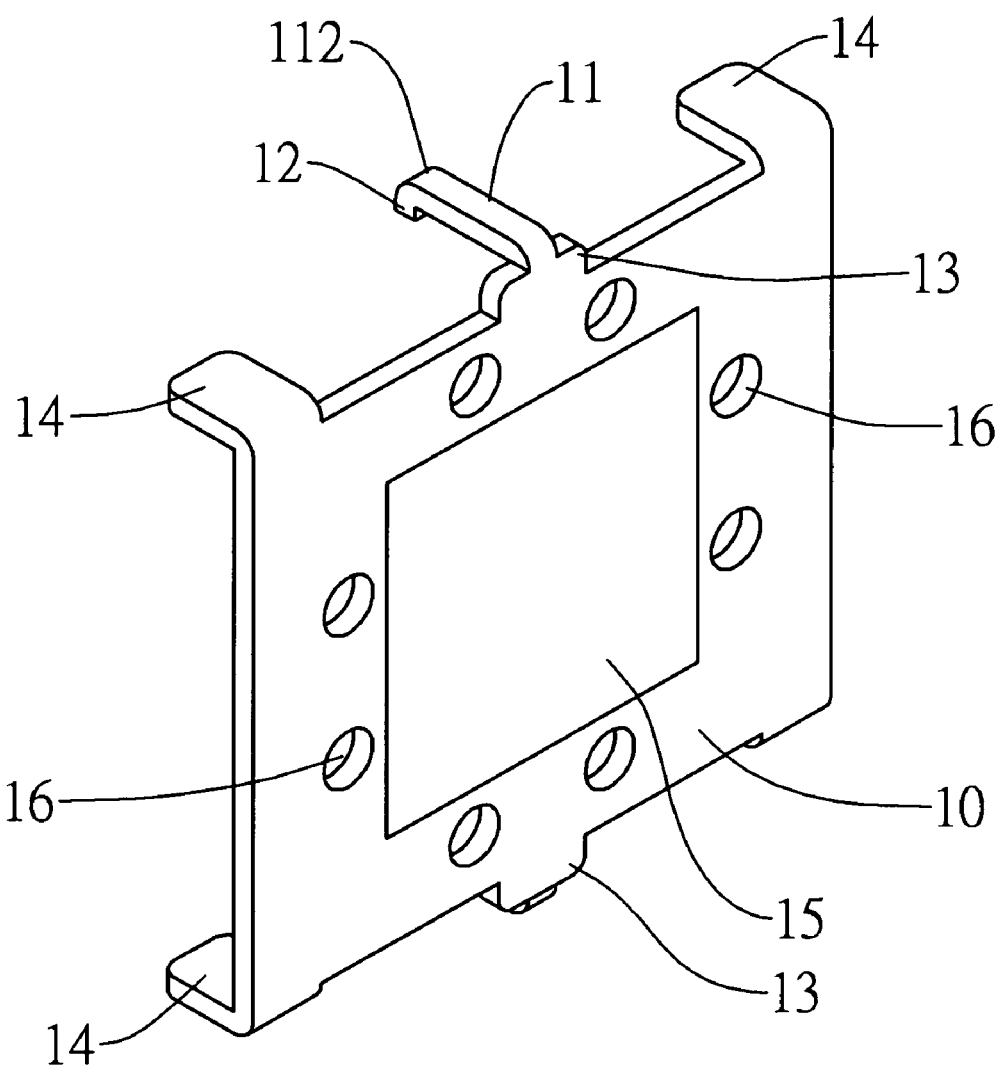
FIG. 3 is a perspective view of the first embodiment of the present invention.
Figure 4:
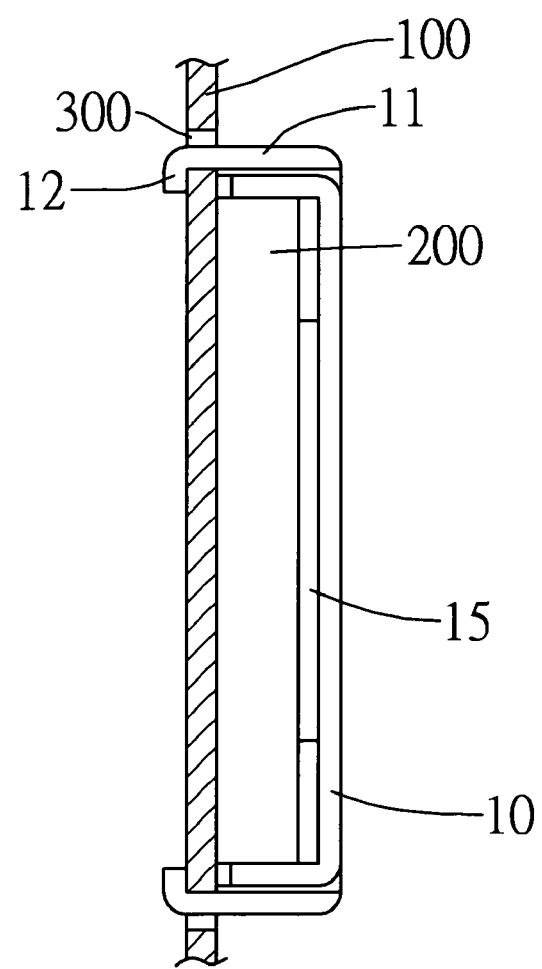
FIG. 4 is a lateral view of the FIG. 3, wherein the present invention is assembled with a memory.
Figure 5:
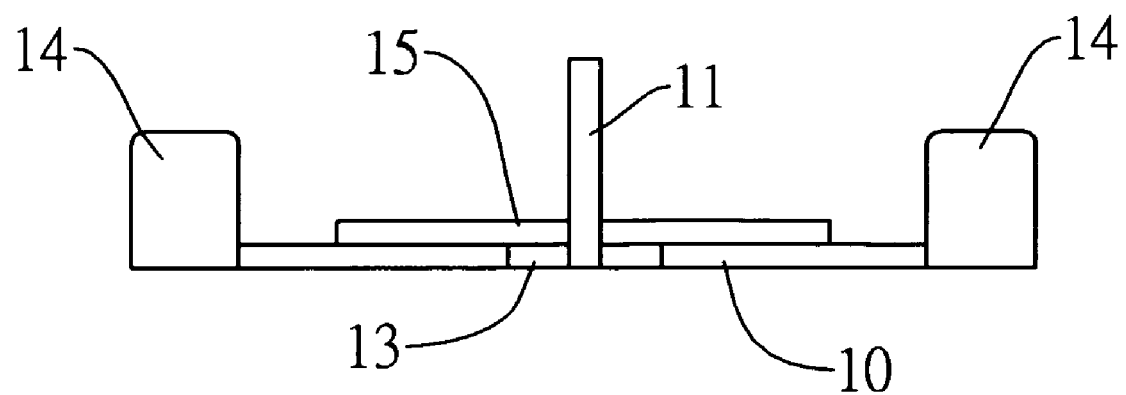
FIG. 5 is an elevational view of FIG. 3.

Referring to FIGS. 3 to 5, the first embodiment of the present invention is illustrated. The present invention is related to a heat dissipating device for a memory chip. The heat dissipating device has the following elements.

A rectangular heat dissipating body 10 has a recess 15 at a center portion thereof. A periphery of the recess 15 is formed with a plurality of through holes 16.

A middle section of each of two opposite sides of the heat dissipating body 10 has a hook 11. A distal end of each hook 11 is bent as a hooking end 12. An outer side of the bending section is chamfered as a guiding angle 112. Each of two sides of connections of the hook 11 and the heat dissipating body 10 is extended with a wall 13.

Each of the four corners of the heat dissipating body 10 is extended with a protrusion 14 which is bent from the heat dissipating body 10 to have the same orientation as that of the hook 11.

Referring to FIG. 4, a circuit board 100 has penetrating holes 300 corresponding to the hooks 11 is illustrated. The positions of the penetrating holes 300 are at a periphery of a memory chip to be positioned on the circuit board 100. The hooks 11 can hook the penetrating holes 300 so that the recess 15 will cover upon the memory chip 200. Heat from the memory chip 200 will be dissipated from the penetrating holes 300.

The guiding angles 113 between the hook 11 and the hooking ends 12 assist the hooks 11 to pass through the penetrating holes 300 in assembly.

The protrusions 14 serves to catch the memory chip 200 so as to position the memory chip 200.

The walls 13 between the hooks 11 and the heat dissipating body 10 serve to enhance the strength and the elasticity of the hooks 11. Thus, the hooks 11 can be extended and can be made thinner.

In the present invention, the structure is integrally formed as an integral body. The heat dissipating device can be assembled quickly by passing the hooks 11 through the penetrating holes 300 of the circuit board 100. Thereby the assembly work is easy and quickly.

Figure 6:
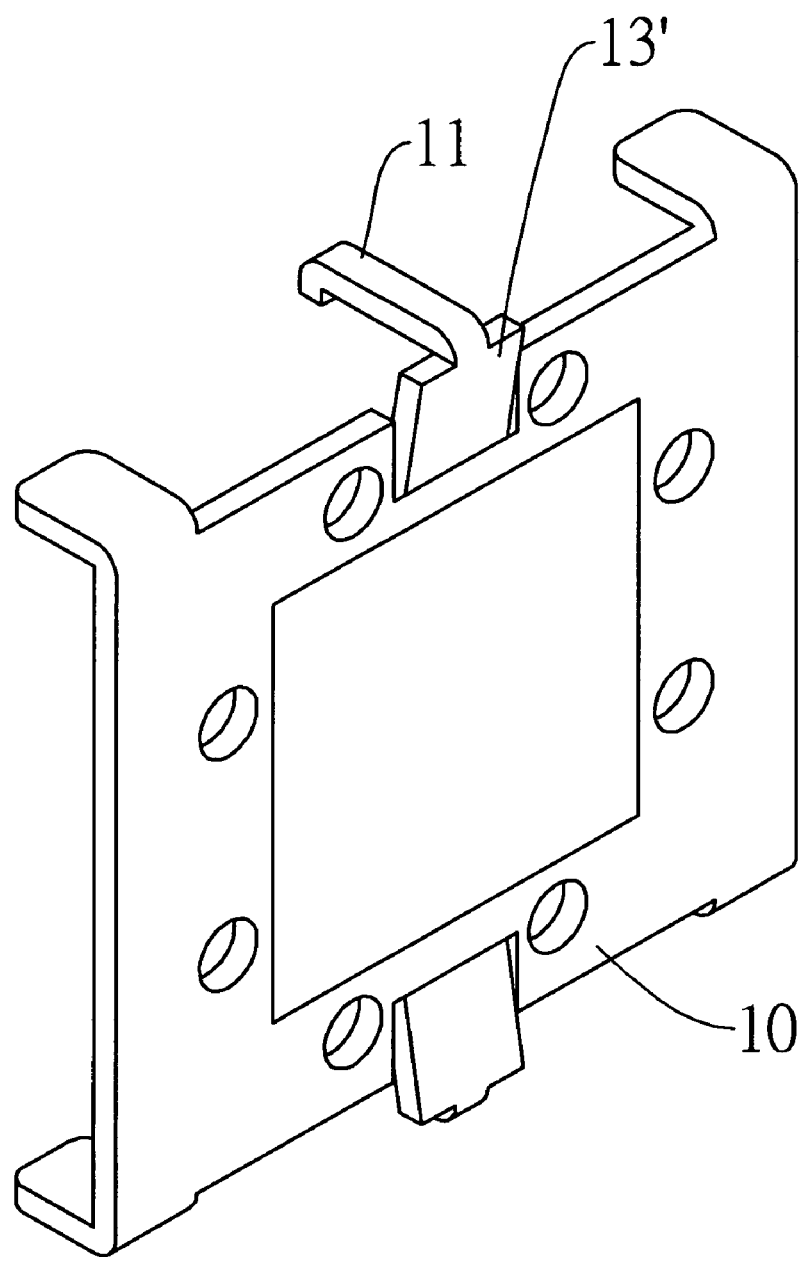
FIG. 6 is a perspective view of the second embodiment of the present invention.
Figure 7:
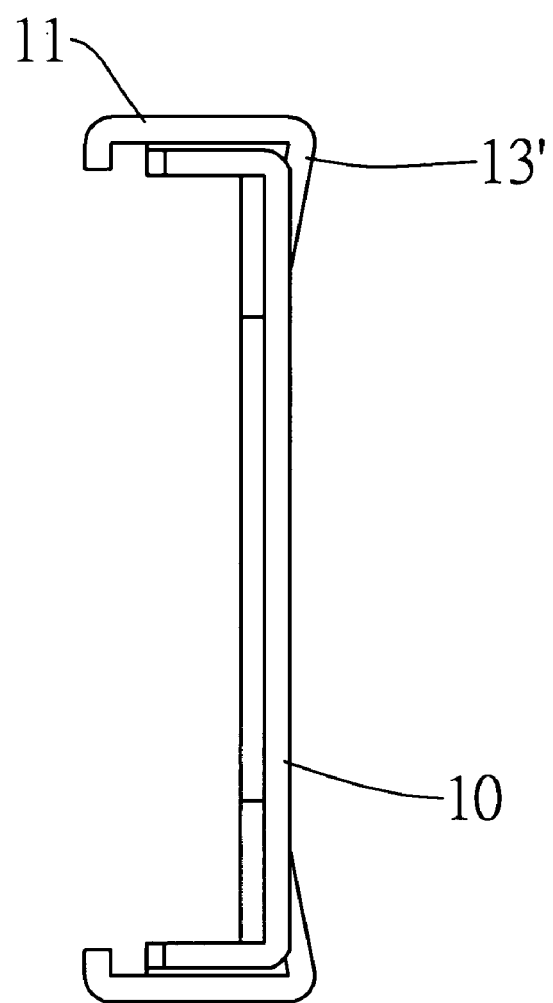
FIG. 7 is a lateral view of FIG. 6.
Figure 8:
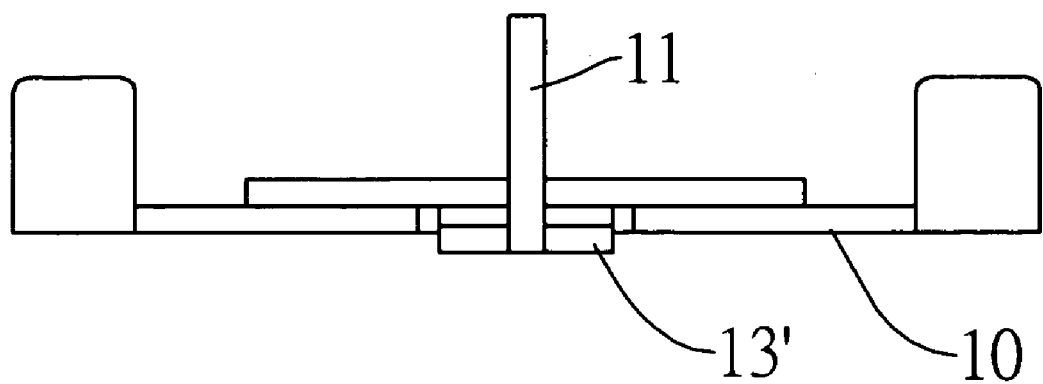
FIG. 8 is an elevational view of FIG. 6.

Referring to FIGS. 6 to 8, the second embodiment of the present invention is illustrated. The difference from the first embodiment is that the walls 13' between the hooks 11 and the heat dissipating body 10 are extended upwards to a direction opposite to the orientation of the hooks 11. Each of the walls 13' has an inclined angle with respect to a surface of the heat dissipating body 10. The object of this design is to increase the elasticity of the hooks 11. Thereby it provides a moving range as it is assembled with a memory chip.

Figure 9:
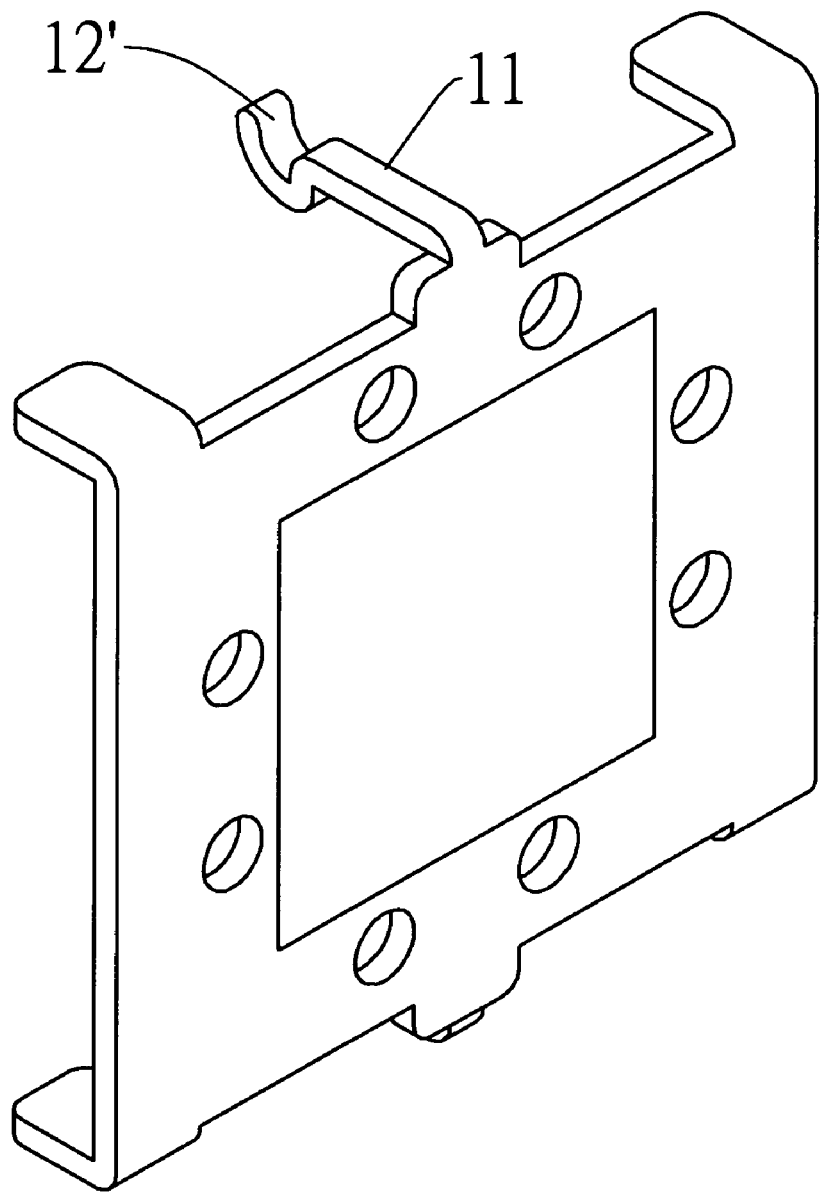
FIG. 9 is a perspective view of the third embodiment of the present invention.
Figure 10:
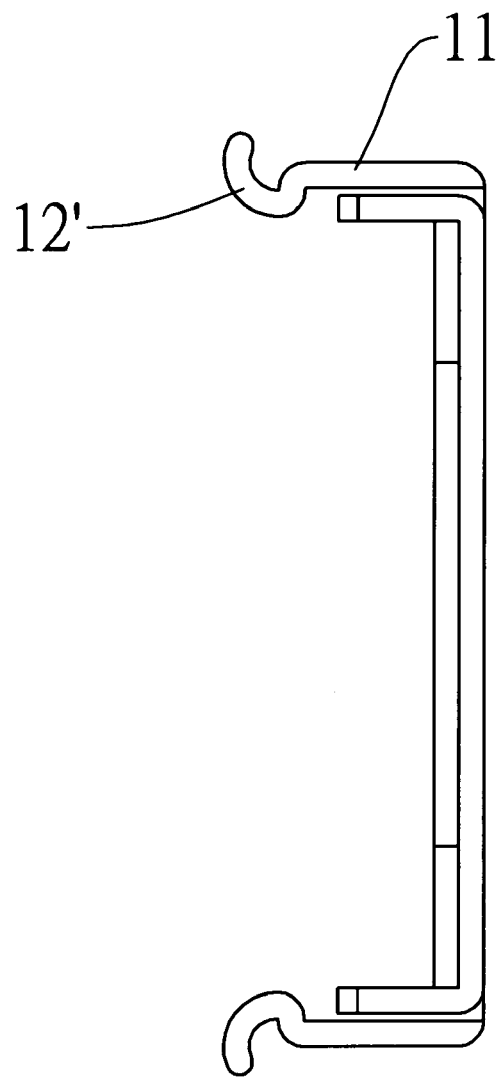
FIG. 10 is a lateral view of FIG. 9.
Figure 11:
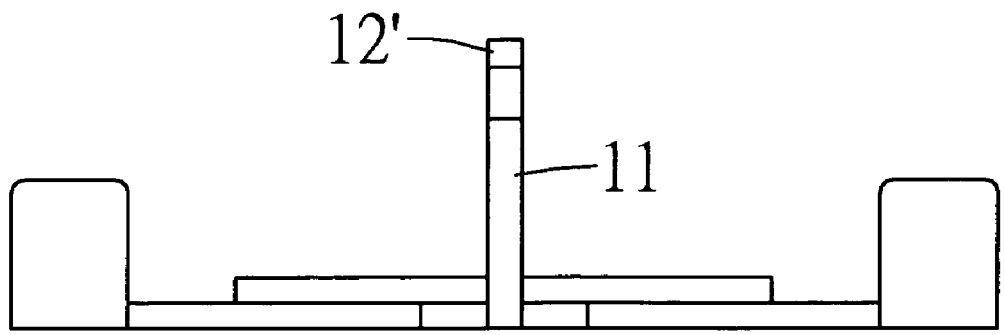
FIG. 11 is an elevational view of FIG. 9.

Referring to FIGS. 9 to 11, the third embodiment of the present invention is illustrated. The difference of this embodiment form the first embodiment is that the hooking end 12' has a cambered shape. The cambered hooking end 12 can passes through the penetrating hole 300 of the circuit board 100.

Figure 12:
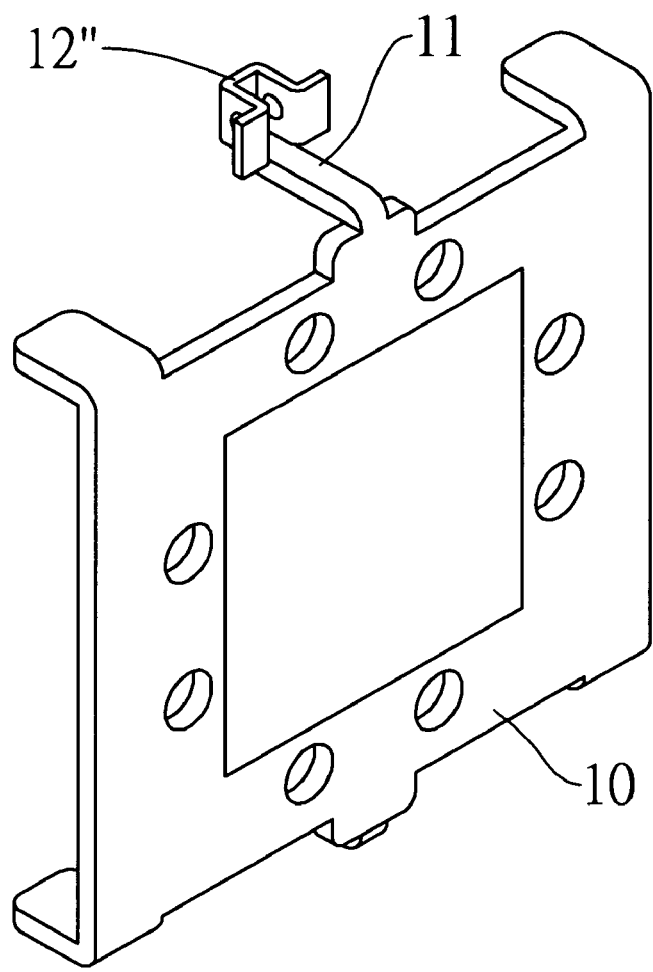
FIG. 12 is a perspective view of the fourth embodiment of the present invention.
Figure 13:
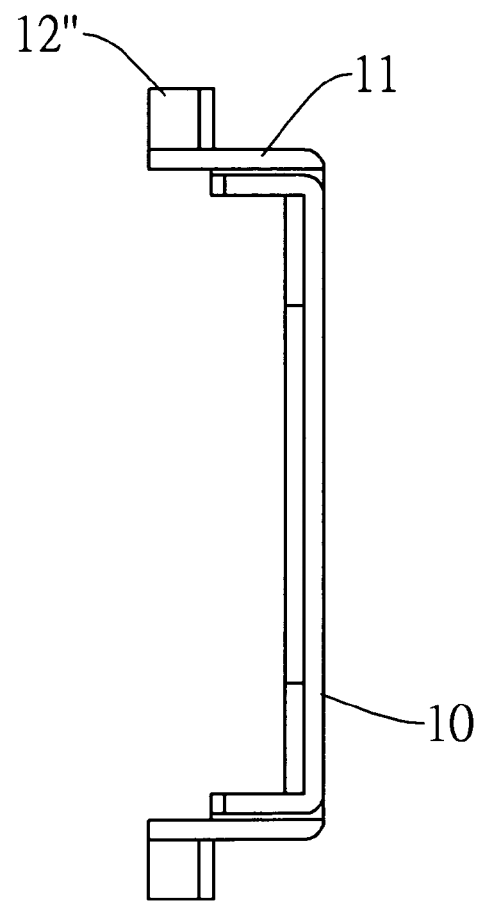
FIG. 13 is a lateral view of FIG. 12.
Figure 14:
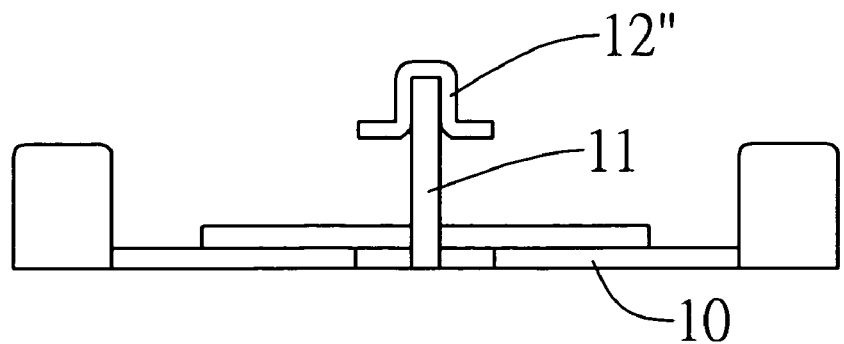
FIG. 14 is an elevational view of FIG. 12.
Figure 14A:
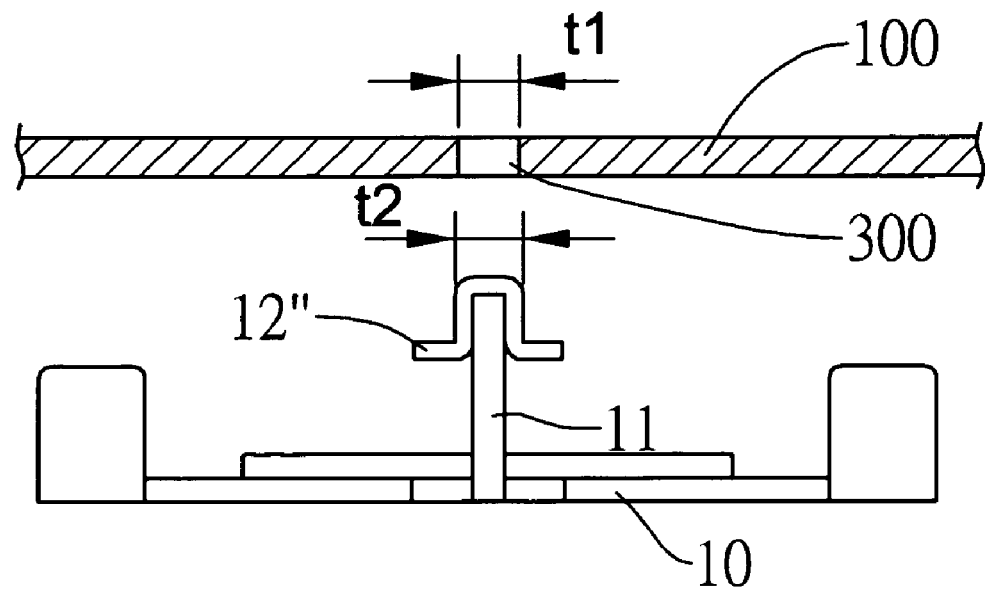
FIG. 14A illustrates the state of FIG. 12 before assembly.
Figure 14B:
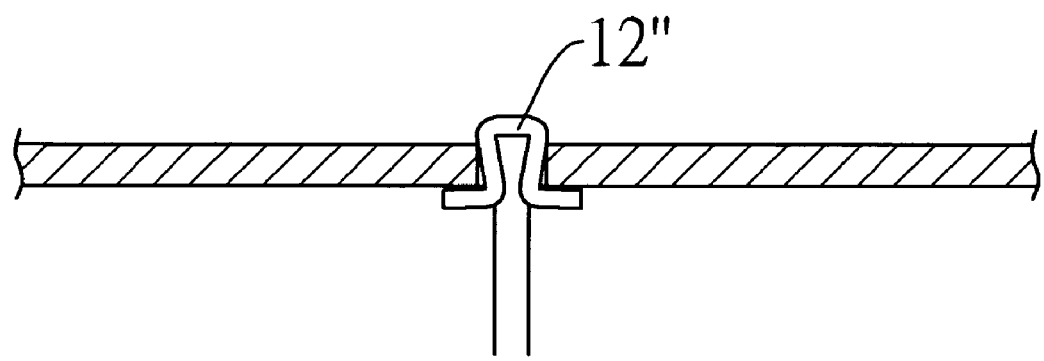
FIG. 14B illustrates the state of FIG. 12 after assembly.

With reference to FIGS. 12 to 14, the fourth embodiment of the present invention is illustrated. The difference of this embodiment form the first embodiment is that the hooking end 12" has a U shape and two opposite distal ends of the U shape hooking end are extended with respective sheets. The distance between the two sheets is greater than a width of the penetrating hole 300. In assembly, the hooking end 12" is deformed to be placed into the penetrating hole 300 and then the two sheets of the hooking end 12" will buckle the penetrating hole 300 so as to fix the heat dissipating device to the circuit board 100, as shown in FIG. 14B.

Figure 15:
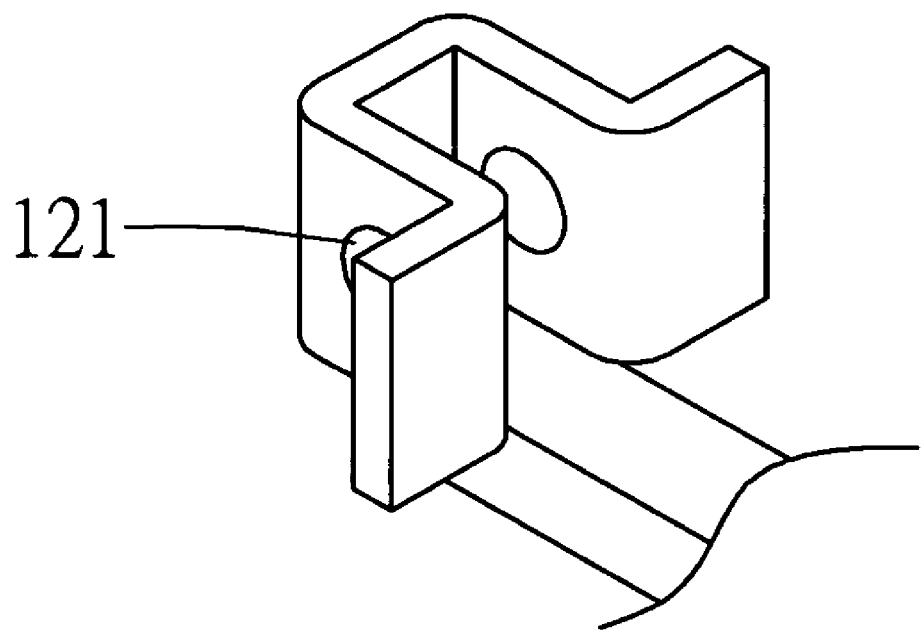
FIG. 15 shows one embodiment of the hook in FIG. 12.

Moreover in FIG. 15, each sheet of the U shape hooking end 12" is protruded with a nose portion 121 for enhancing the stability when the heat dissipating device is assembled to the circuit board 100.

Figure 16:
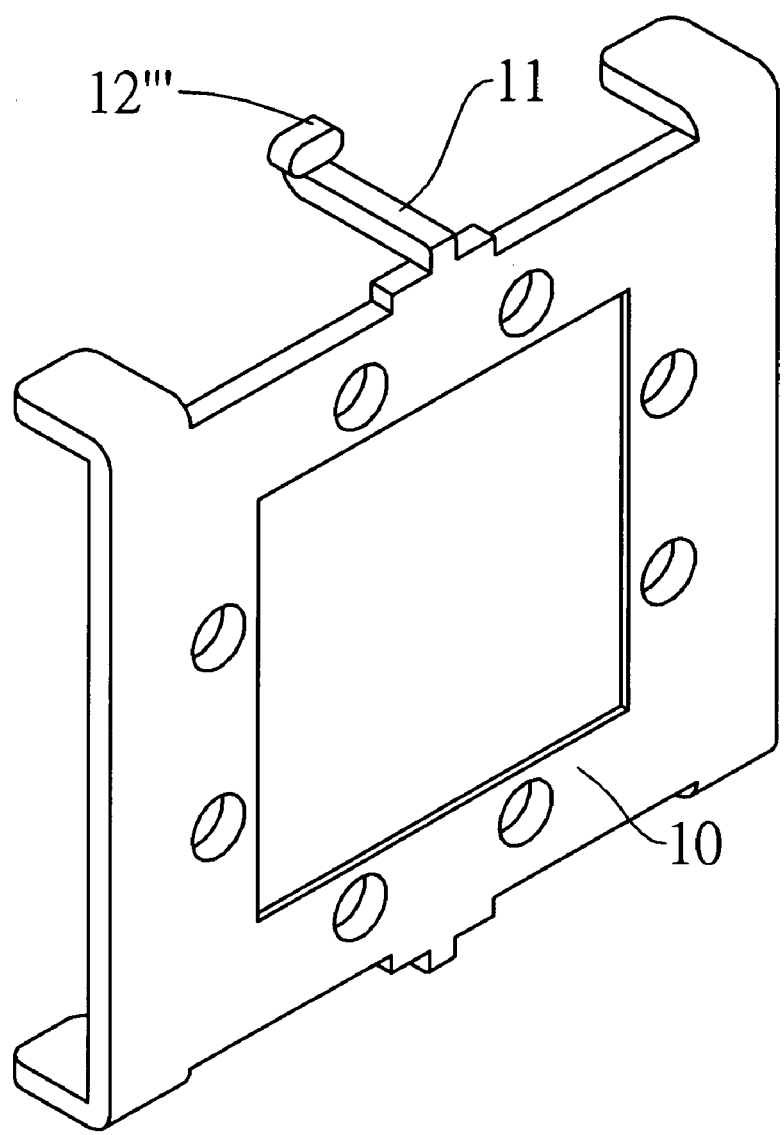
FIG. 16 is a perspective view about another embodiment of the present invention.
Figure 17:
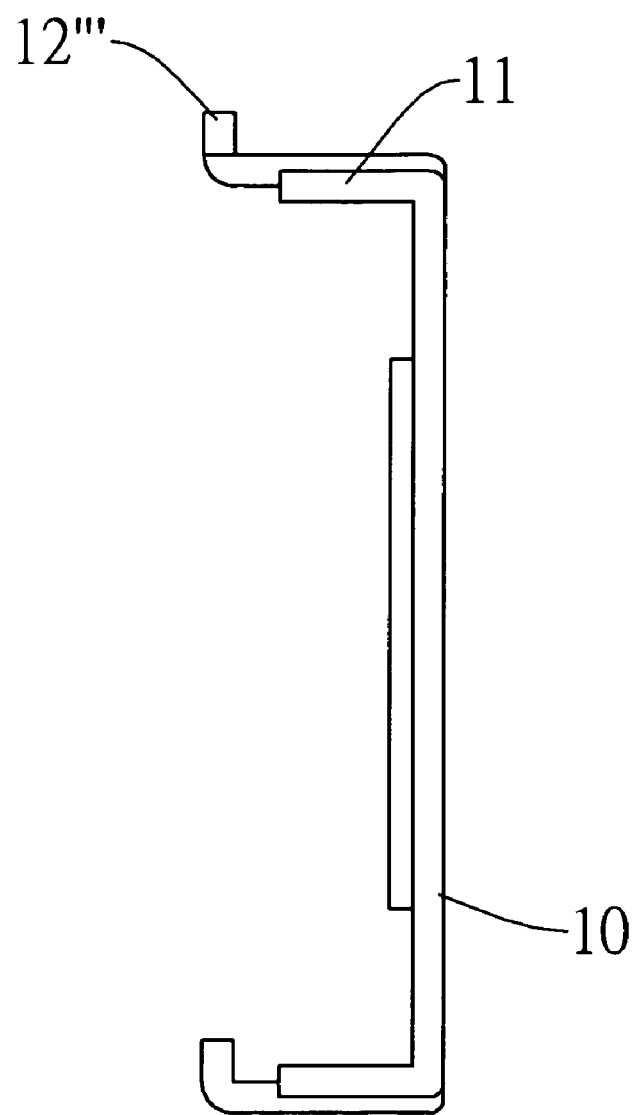
FIG. 17 is a lateral view of FIG. 16.
Figure 18:
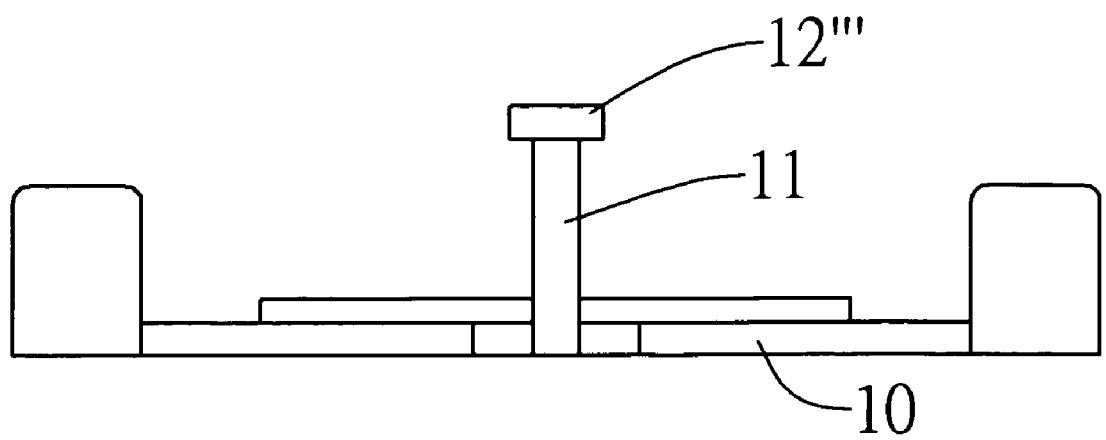
FIG. 18 is an elevational view of FIG. 16.

Referring to FIGS. 16 to 18, another embodiment of the present invention is illustrated. In this embodiment, the hooking ends 12''' at two sides are faced to the same direction.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipating device for a memory chip; the heat dissipating device being installable to a surface of a circuit board for fixing a memory chip on the circuit board; the circuit board having a plurality of penetrating holes; positions of the penetrating holes being at a periphery of the memory chip to be positioned on the circuit board; the heat dissipating device comprising:

a rectangular heat dissipating body having a rectangular recess at a center portion thereof; each side of a periphery of the recess being formed with a plurality of through holes;

a middle section of each of two opposite sides of the heat dissipating body having a wall and a hook being extended from the wall to point away from the heat dissipating body 10; a distal end of each hook being bent as a hooking end; an outer side of the bending section being chamfered as a guiding angle; the walls being between the hooks and the heat dissipating body and being wider than the hook for enhancing the strength and the elasticity of the hooks; thus, the hooks can be extended and can be made thinner; and each of four corners of the heat dissipating body being extended with a protrusion which is bent from the heat dissipating body to have the same orientation as the hook; and wherein in assembly, the hooks is hooked to the penetrating holes so that the recess will cover upon the memory chip; heat from the memory chip will dissipated from the penetrating holes; the guiding angles between the hook and the hooking ends assists the hooks passing through the penetrating holes in assembly; and the protrusions serves to catch the memory chip so as to position the memory chip.

2. The heat dissipating device as claimed in claim 1, wherein the hooking end is bent inwards to be approached to a center of the heat dissipating body.

3. The heat dissipating device as claimed in claim 1, wherein the hooking end has a cambered shape which is bent outwards to a direction pointed away from a center of the heat dissipating body.

4. The heat dissipating device as claimed in claim 1, wherein a wall between a hook and the heat dissipating body is extended upwards to a direction opposite the orientation of the hooks so that the walls has an inclined angle with respect to a surface of the heat dissipating body.

5. The heat dissipating device as claimed in claim 4, wherein the hooking end has a U shape and two opposite distal ends of the U shape hooking end are extended with respective sheets; and the distance between the two sheets is greater than a width of the penetrating hole.

6. The heat dissipating device as claimed in claim 5, wherein each sheet of the U shape hooking end is protruded with a nose portion for enhancing the stability that the heat dissipating device is assembled to the circuit board.

7. The heat dissipating device as claimed in claim 1, wherein the hooking ends at two sides are faced to the same direction.

* * * * *